United States Patent [19]

Ikeda et al.

[11] Patent Number: 5,198,986
[45] Date of Patent: Mar. 30, 1993

[54] CROSSTALK VERIFICATION DEVICE

[75] Inventors: Minoru Ikeda; Tsunesato Munakata, both of Itami, Japan

[73] Assignee: Mitsubishi Denki Kabushiki Kaisha, Tokyo, Japan

[21] Appl. No.: 582,106

[22] Filed: Sep. 14, 1990

[30] Foreign Application Priority Data

Dec. 22, 1989 [JP] Japan ................................. 1-333901

[51] Int. Cl.⁵ ............................................. G06F 15/60
[52] U.S. Cl. .................................... 364/489; 364/488
[58] Field of Search ............... 364/488, 489, 490, 491, 364/578; 357/45, 42, 41; 307/475

[56] References Cited

U.S. PATENT DOCUMENTS

| | | | |
|---|---|---|---|
| 4,683,384 | 7/1987 | Shibata et al. | 364/491 |
| 4,694,403 | 9/1987 | Nomura | 364/488 |
| 4,896,272 | 1/1990 | Kurosawa | 364/491 |
| 4,970,664 | 11/1990 | Kaiser et al. | 364/488 |
| 5,010,493 | 4/1991 | Matsumoto et al. | 364/490 |

*Primary Examiner*—Vincent N. Trans
*Attorney, Agent, or Firm*—Oblon, Spivak, McClelland, Maier & Neustadt

[57] ABSTRACT

Output interconnection line patterns of transistors easily exerting influences of crosstalk and transistors easily influenced by crosstalk are extracted from layout pattern data stored in a layout pattern data memory by an output interconnection line pattern extracting portion. Then, in these output interconnection line patterns, an overlapping portion and a parallel portion which probably may be the cause of crosstalk are extracted as error portions by an error extracting portion. These error portions are visually displayed by a display unit. Thus, automatic verification of crosstalk is performed.

29 Claims, 12 Drawing Sheets

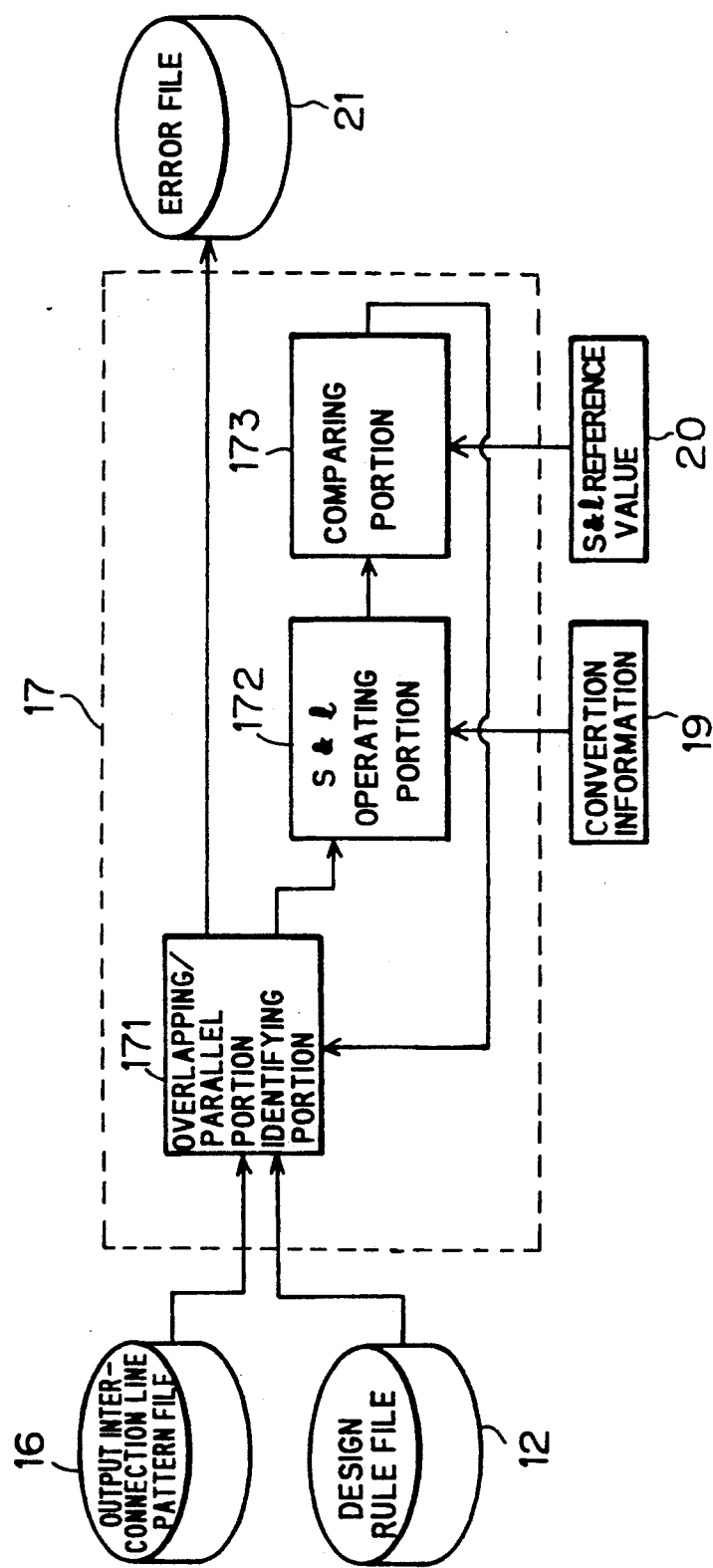

CROSSTALK VERIFICATION DEVICE

BACKGROUND OF THE INVENTION

1. Field of the Invention

The present invention relates to a crosstalk verification device for automatically verifying whether or not there is a dangerous portion where crosstalk may occur, for a layout pattern of a designed large scale integrated circuit.

2. Description of the Background Art

In an integrated circuit, since a transistor of low output impedance has a great driving ability, the output waveform on the output line of the transistor becomes abrupt, and as a result, it includes large high frequency components. Thus, such a transistor easily exerts the influence of crosstalk to other line. On the other hand, since a transistor of high output impedance has a poor driving ability, it can not cancel noise well if it appears on its output interconnection line. Thus, such a transistor is easily influenced by the crosstalk from other interconnection line. Conventionally, the designer visually observes to confirm whether or not there is a dangerous portion where the crosstalk may occur for a layout pattern of a designed large scale integrated circuit. That is, the designer, visually searching the layout pattern, identifies the transistor of low output impedance easily exerting influences of crosstalk with the transistor of high output impedance easily influenced by crosstalk in the pattern, and traces the output interconnection line of those transistors, so as to estimate the combination and the place of the output interconnection lines which easily generate the crosstalk.

However, the visual verification of the designer may arise the problem that the designer have to do laborious work. There also arises the problem that some portions where there is a danger of occurrence of crosstalk may sometimes escape the designer's attention.

Further, in view of making integrated circuits larger in scale and making the patterns smaller in future, there is the prospect that with the visual verification by the designers, accurate verification of crosstalk should take place with further difficulty.

SUMMARY OF THE INVENTION

In the first aspect, a crosstalk verification device according to the present invention comprises first providing means for providing layout pattern data defining a layout pattern to be verified, second providing means for providing a design rule on the layout pattern to be verified, first storing means for storing a first reference on a size of a transistor easily exerting an influence of crosstalk and a second reference on a size of a transistor easily influenced by crosstalk, first extracting means coupled with the first and second providing means and the first storing means for extracting data on output interconnection line patterns of a first transistor satisfying the first reference and a second transistor satisfying the second reference out of transistors in the layout pattern to be verified, from the layout pattern data, by processing the layout pattern data with the design rule and the first and second reference referred, second storing means for storing a third reference on an area of an overlapping portion of output interconnection lines and a fourth reference on a length of a parallel portion of the output interconnection lines, second extracting means coupled with the first extracting means and the second storing means for extracting as error portions the overlapping portion of an area exceeding the third reference and the parallel portion of a length exceeding the fourth reference between the output interconnection lines of the first and second transistors by processing the data on output interconnection patterns with the third and fourth references referred, display means connected with the second extracting means for visually displaying the error portions.

In the second aspect, a crosstalk verification device according to the present invention comprises first providing means for providing layout pattern data defining a layout pattern to be verified, second providing means for providing a design rule on the layout pattern to be verified, first storing means for storing a first reference on a size of a transistor easily exerting an influence of crosstalk and a second reference on a size of a transistor easily influenced by crosstalk, first extracting means coupled with the first and second providing means and the first storing means for extracting data on output interconnection line patterns of a first transistor satisfying the first reference and a second transistor satisfying the second reference out of transistors in the layout pattern to be verified, from the layout pattern data, by processing the layout pattern data with the design rule and the first and second reference referred, second storing means for storing a third reference on a capacity of overlapping and parallel portions of output interconnection lines, second extracting means coupled with the first extracting means and the second storing means for extracting as error portions the overlapping and parallel portions of a capacity exceeding the third reference of the output interconnection lines of the first and second transistors by processing the data on output interconnection patterns with the third reference referred, display means connected with the second extracting means for visually displaying the error portions.

In the third aspect, a crosstalk verification device according to the present invention comprises first providing means for providing layout pattern data defining a layout pattern to be verified, second providing means for providing a design rule on the layout pattern to be verified, first storing means for storing a first reference on a size of a transistor easily exerting an influence of crosstalk and a second reference on a size of a transistor easily influenced by crosstalk, first extracting means coupled with the first and second providing means and the first storing means for extracting data on output interconnection line patterns of a first transistor satisfying the first reference and a second transistor satisfying the second reference out of transistors in the layout pattern to be verified, from the layout pattern data, by processing the layout pattern data with the design rule and the first and second reference referred, second storing means for storing a third reference on an area of an overlapping portion of output interconnection lines and a fourth reference on a length of a parallel portion of the output interconnection lines, third storing means for storing a fifth reference on a capacity of the overlapping and parallel portions of output interconnection lines, second extracting means composed of an ante-stage extracting means coupled with the first extracting means and the second storing means for extracting as error portions the overlapping portion of an area exceeding the third reference and the parallel portion of a length exceeding the fourth reference between the output interconnection lines of the first and second transistors by processing the data on output interconnection patterns with the third and fourth references referred and a post-stage extracting means coupled with the third storing means and the ante-stage extracting means for extracting as an effective error portion only the error portions which is larger in capacity than the fifth reference, display means connected with the second extracting means for visually displaying the error portions.

According to the present invention, output interconnection line patterns of transistors easily exerting influences of crosstalk and of transistors easily influenced by crosstalk are extracted from layout pattern data by first extracting means, and then, in these output interconnection line patterns, an overlapping portion and a parallel portion which probably may be the cause of crosstalk are extracted as error portions by second extracting means. The error portions can be visually confirmed by display means. Thus, there is obtained the effects that automatic verification of crosstalk is made possible and that accurate verification of crosstalk is made possible even when the scale of the integrated circuits is made larger and the pattern is made smaller.

Accordingly, it is an object of the present invention to provide a crosstalk verification device capable of automatically verifying whether or not there is a dangerous portion where crosstalk may occur for a layout pattern of a large scale integrated circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a block diagram showing an error extracting portion of the device of FIG. 1;

DETAILED DESCRIPTION OF THE PREFERRED EMBODIMENTS

Figure 1:
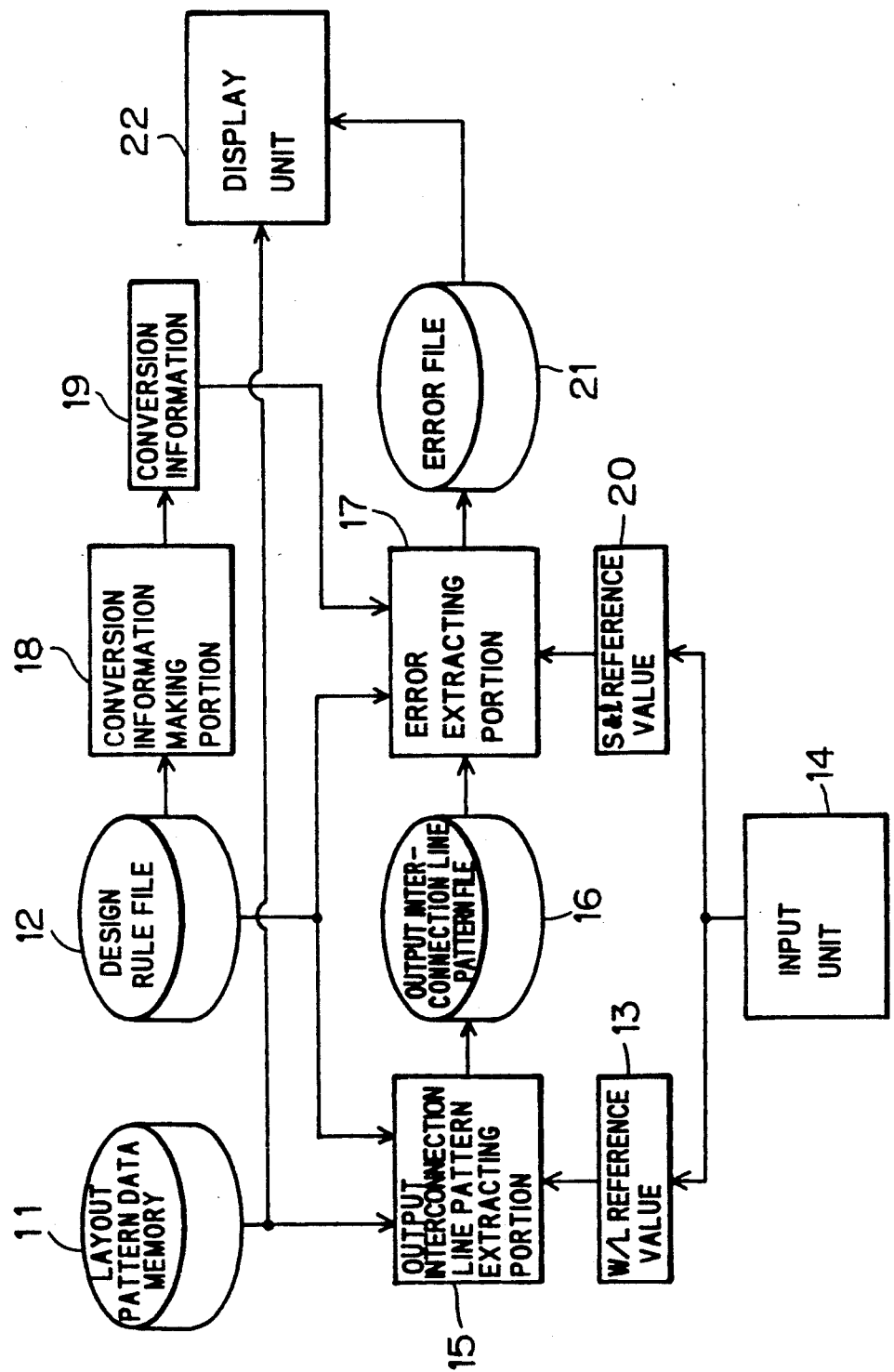
FIG. 1 is a block diagram showing an embodiment of a crosstalk verification device according to the present invention.
Figure 2:
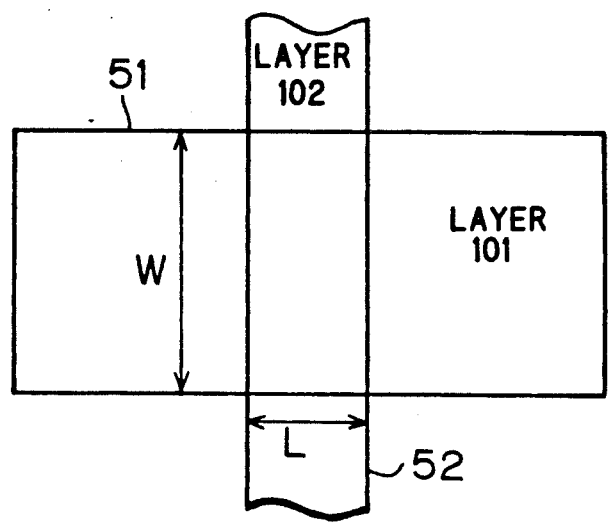
FIG. 2 is a plan view showing a single transistor portion in a layout pattern.

FIG. 1 is a block diagram showing an embodiment of a crosstalk verification device according to the present invention. Layout pattern data to define a layout pattern to be verified is stored in a layout pattern data memory 11. The layout pattern data includes information such as layers and coordinates with respect to respective drawing elements composing a layout pattern. FIG. 2, as an example, is a plan view showing a single transistor portion in the layout pattern, and the transistor is composed of two intersecting drawing elements 51 and 52. In the layout pattern data, the drawing elements 51 and 52 are determined as layers 101 and 102 and the positional relations between the drawing elements 51 and 52 are defined by coordinates information representing a plurality of specified points. The layer 101 corresponds to source and drain regions of a transistor, and the layer 102 corresponds to a gate region.

Various rules are defined or described in a design rule file 12. In the definition or description, those which are related to the embodiment are as follows:

(i) the definition of a transistor and an interconnection line in the layout pattern;

(ii) the definition of a gate length L and a gate width W of the transistor;

(iii) the definition of the source and drain regions of the transistor;

(iv) the description indicating the thickness of an insulating film, the thickness of an interconnection line film and the dielectric constant of the insulating film; and (v) the description indicating the minimum value of a distance between interconnecting lines.

Figure 3:
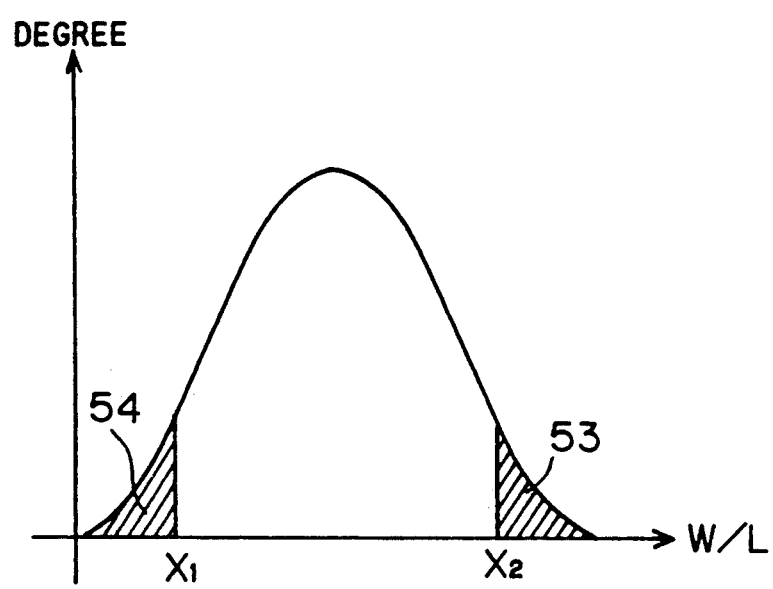
FIG. 3 is a graph showing an example of the distribution of the size of all transistors in the layout pattern.

On the other hand, reference values $X_1$ and $X_2$ of a transistor size W/L inputted through an input unit 14 are stored in a W/L reference value storing portion 13. FIG. 3 is a graph showing an example of the distribution of the size W/L of all the transistors in the layout pattern. A transistor of low output impedance, which easily exerts of influences of crosstalk, is included in a region 53 satisfying $W/L > X_2$, while a transistor of high output impedance, which is easily influenced by crosstalk, is included in a region 54 satisfying $W/L < X_1$. That is, the reference values $X_1$ and $X_2$ stored in the W/L reference value storing portion 13 are references for distinguishing the transistor easily exerting the influence of crosstalk and the transistor easily influenced by crosstalk from other transistors in the layout pattern.

An output interconnection line pattern extracting portion 15 extracts only the output interconnection line patterns of the transistor easily exerting the influence of crosstalk and the transistor easily influenced by crosstalk, by processing the layout pattern data in the layout pattern data memory 11, referring to the contents of the design rule file 12 and the W/L reference value storing portion 13, so as to store the data extracted in an output interconnection line pattern file 16.

Figure 4:
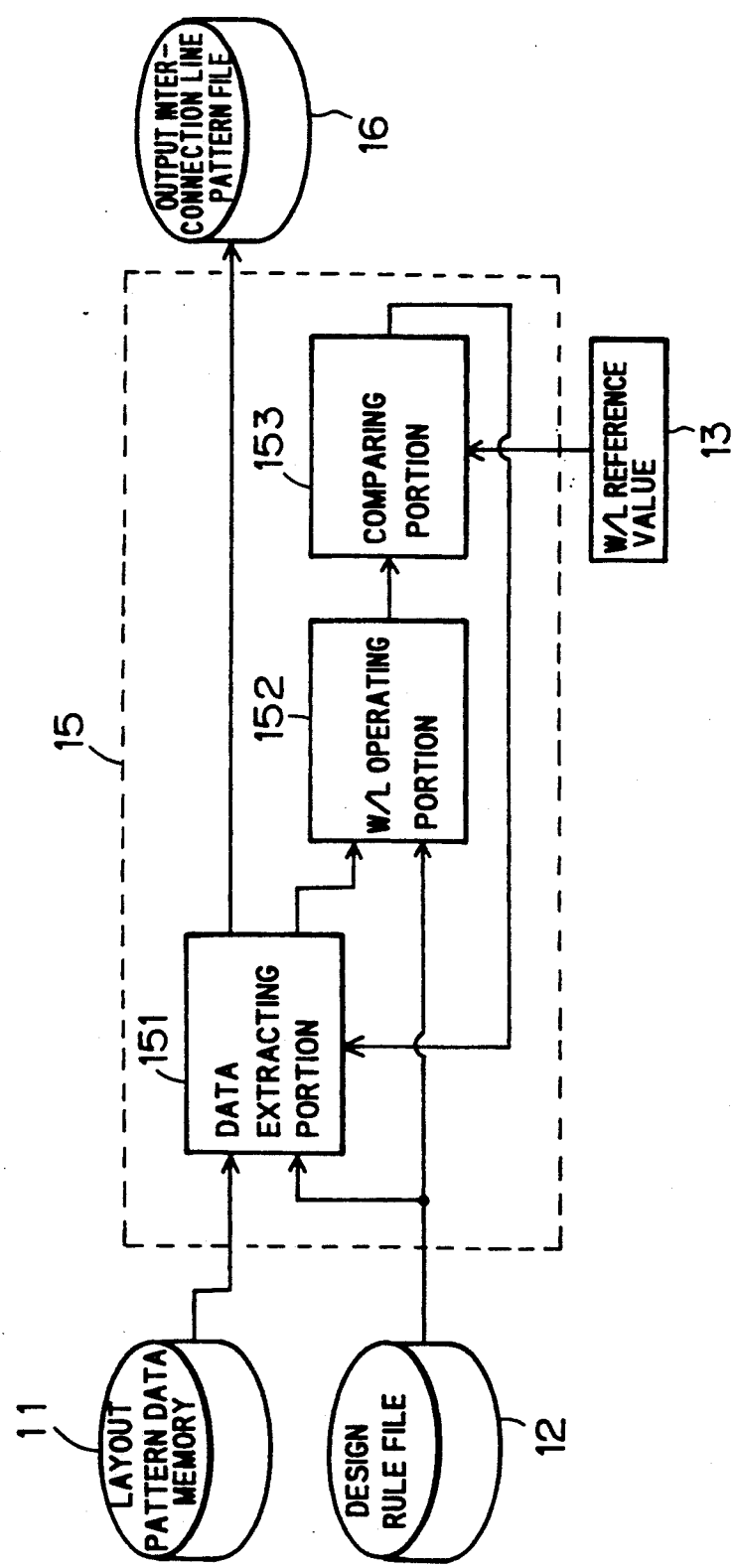
FIG. 4 is a block diagram showing in detail an output interconnection line pattern extracting portion of the device of FIG. 1.

FIG. 4 is a block diagram showing in detail the output interconnection line pattern extracting portion 15. The output interconnection line pattern extracting portion 15 consists of a data extracting portion 151, a W/L operating portion 152 and a comparing portion 153.

The data extracting portion 151 identifies a transistor in the layout pattern by applying the definition (i) in the design rule file 12 to the layout pattern data stored in the layout pattern data memory 11, and extracts the data on the pattern of the transistor to apply it to the W/L operating portion 152. In the transistor's definition in the definition (i), for example, by describing that "an overlapping portion of the drawing element of the layer number 101 and that of the layer number 102 is a transistor", the transistor of FIG. 2 in the layout pattern is identified. The data extracting portion 151 extracts data on layers and coordinates relating to the drawing elements composing the transistors thus identified from the layout pattern data to apply it to the W/L operating portion 152.

The W/L operating portion 152 performs operations to obtain the transistor size W/L by applying the definition (ii) in the design rule file 12 to the applied data. In the definition (ii), for example, by defining that "the length along which the layer 102 crosses the layer 101 is W, and the width with which the layer 102 crosses the layer 101 is L", the gate length L and the gate width W of the transistor are obtained. Specifically, the coordinates of the cross point of the layers 101 and 102 are first calculated, and then the gate length L and the gate width W are calculated according to the definition (ii) by using the coordinates of the cross point. The ratio of the gate length L to the gate width W is obtained, and thus eventually the transistor size W/L is calculated. The transistor size W/L thus calculated is applied to the comparing portion 153.

The comparing portion 153 compares the transistor size W/L with the reference values $X_1$ and $X_2$ stored in the W/L reference value storing portion 13. The result of the comparison corresponds to any of the followings:

$C_1: W/L > X_1$ $C_2: X_1 \geq W/L \geq X_2$ $C_3: W/L < X_2$

The comparison results $C_1$ to $C_3$ are applied to the data extracting portion 151.

The data extracting portion 151, when it receives the comparison result $C_2$ from the comparing portion 153, does not extracts new data on the transistor previously identified but identifies another transistor in the layout pattern.

Meanwhile, the data extracting portion 151, when it receives the comparison results $C_1$ or $C_3$, extracts new data on the transistor previously identified, i.e., the coordinates data of the output interconnection line pattern of the transistor. The recognition of the output interconnection line is performed based upon the definition (iii). In the definition (iii), for example, by describing that "portions of the layer 101 on opposite sides of the layer 102 are source and drain regions", the source and drain regions of the transistor of FIG. 2 are recognized. In the source and drain regions thus recognized, all that are not connected to external input terminals of the LSI, a power source and a GND are recognized as output terminals of the transistor. In the layout pattern data, since information called "text" is added in the region of the layout pattern connected to the external input terminals of the LSI, a power source and a GND, it is possible to confirm whether or not the recognized source and drain regions are connected to the external input terminals of the LSI, the power source and the GND by referring to this information.

In the data extracting portion 151, the coordinate data of interconnection line patterns connected to the source and drain regions recognized as the output terminals (i.e., output interconnection line pattern) is extracted from the layout pattern data by applying the interconnection-line's definition in the definition (i), and is stored in the output interconnection line pattern file 16. To the coordinate data of the output interconnection line patterns stored in the output interconnection line pattern file 16, additional data is added to judge whether the coordinate data corresponds to the comparison result $C_1$ (i.e., the output interconnection line is that of a transistor of relatively large size which easily exerts the influence of crosstalk) or to the comparison result $C_3$ (i.e., the output interconnection line is that of a transistor of relatively small size which is easily influenced by crosstalk). Otherwise, instead of adding the additional data, the storage regions in the output interconnection line pattern file 16 may simply be distinguished from each other.

Referring back to FIG. 1, the error extracting portion 17 applies to an error file 21, as error information, coordinate data specifying overlapping and parallel portions of output interconnection lines of the transistor easily exerting the influence of crosstalk and the transistor easily influenced by crosstalk, with respect to a pair of the output interconnection lines which have predetermined values or over in total values of areas of the overlapping portions and lengths of the parallel portions, by processing the coordinate data of the output interconnection line patterns in the output interconnection line pattern file 16, referring to the contents of the design rule file 12, a conversion information storing portion 19 and S & l reference value storing portion 20.

FIG. 5 is a block diagram showing the error extracting portion 17 in detail. The error extracting portion 17 consists of an overlapping/parallel portion identifying portion 171, S & l operating portion 172 and a comparing portion 173.

Figure 6A:
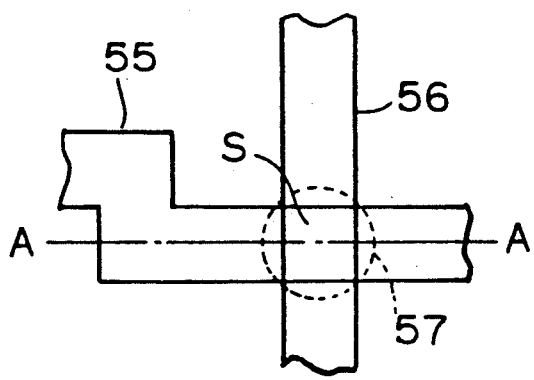
FIG. 6A is a plan view showing an overlapping portion of output interconnection line.
Figure 6B:
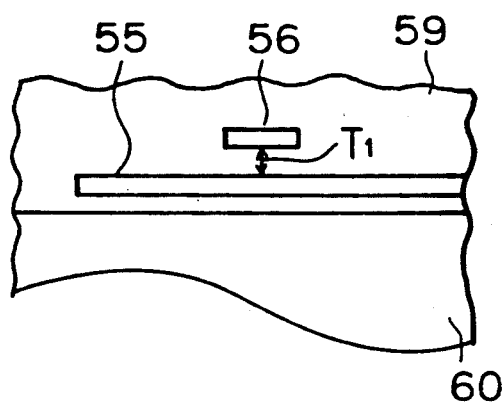
FIG. 6B is a sectional view taken along the line A—A of FIG. 6A.
Figure 7A:
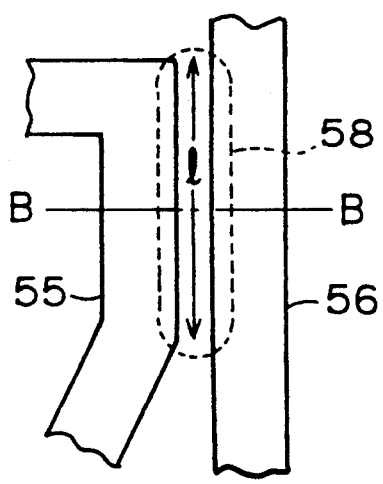
FIG. 7A is a plan view showing a parallel portion of the output interconnection line.
Figure 7B:
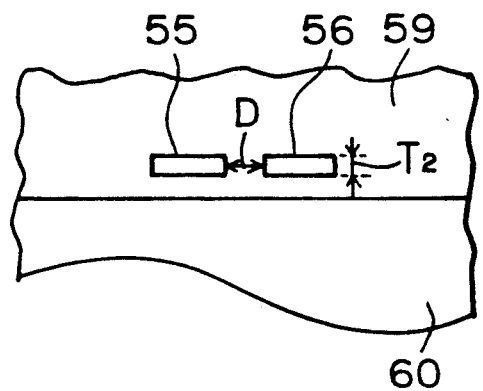
FIG. 7B is a sectional view taken along the line B—B of FIG. 7A.

The overlapping/parallel portion identifying portion 171 identifies a portion 57 where an output interconnection line 55 of the transistor easily exerting influences of crosstalk and an output interconnection line 56 of the transistor easily influenced by crosstalk overlap with each other and a portion 58 where the output interconnection lines 55 and 56 are in parallel, as shown in FIGS. 6A and 7A, based upon the coordinate data on the output interconnection line patterns stored in the output interconnection line pattern file 16, and finds a distance D between interconnection lines in the parallel portion 58. The overlapping/parallel portion identifying portion 171 refers to the description in the definition (v) in the design rule file 12 to recognize only the parallel portion 58 having a line-to-line distance D approximate to the minimum value indicated by the definition (v) to be the effective parallel portion 58. The overlapping/parallel portion identifying portion 171 applies coordinate data specifying the overlapping portion 57 and the effective parallel portion 58 to the S & l operating portion 172. Hereupon, FIG. 6B is a sectional view taken along the line A—A of FIG. 6A, and FIG. 7B is a sectional view taken along the line B—B of FIG. 7A.

The S & l operating portion 172 performs operations to find the area S of the overlapping portion 57 and the length l of the effective parallel portion 58 based upon the coordinate data received from the overlapping/parallel portion identifying portion 171. When there are more than one of the overlapping portions 57 or the effective parallel portions 58 for a specific pair of the interconnection lines 55 and 56, the S & l operating portion 172 finds the total of the areas S of the overlapping portions 57 or the total of the lengths l of the effective parallel portions 58. When there are both the overlapping portions 57 and the effective parallel portions 58 for a specific pair of the output interconnection lines 55 and 56, the S & l operating portion 172 converts the areas S of the overlapping portions 57 into the lengths l or the lengths l of the effective parallel portions 58 into the areas S based upon the conversion information stored in the conversion information storing portion 19 and thereafter finds the total of the areas S or lengths l.

The conversion information stored in the conversion information storing portion 19 is made in the conversion information making portion 18. The capacity $C_1$ of the overlapping portion in FIG. 6A and the capacity $C_2$ of the parallel portion 58 in FIG. 7A are expressed, respectively, as follows:

$$C_1 = \epsilon S / T_1 \quad (1)$$

$$C_2 = \epsilon T_2 l / D \quad (2)$$

where $\epsilon$ is a dielectric constant of an insulating film 59 formed on a substrate 60, $T_1$ is a thickness of the insulating film 59 between the lines 55 and 56 in the overlapping portion 57 and $T_2$ is a film thickness of the interconnection lines 55 and 56. The overlapping portion 57 and the parallel portion 58 exert influences with respect to crosstalk to the same extent when $C_1 = C_2$ is satisfied. Therefore, the following conversion equation can be obtained by making that the equation (1) equals the equation (2).

$$S = (T_1 T_2 / D) \cdot l \quad (3)$$

$$l = (D / T_1 T_2) \cdot S \quad (4)$$

The conversion information making portion 18 obtains the values of the thickness $T_1$ of the insulating film and the thickness $T_2$ of the interconnection line film by referring to the description of the definition (iv) in the design rule file 12 and makes the conversion information by substituting the values into the equations (3) and (4) to have the information stored in the conversion information storing portion 19.

The S & l operating portion 172 refers the conversion information stored in the conversion information storing portion 19 and substitutes the values l and D into the equation (3) when l is to be converted to S, or substitutes the values S and D into the equation (4) when S is to be converted into l. Thus, the conversion from l into S, or from S into l is carried out.

In the S & l reference value storing portion 20 the reference values of S and l received from the input unit 14 are stored in advance. The comparing portion 173 compares the value S or l or the total of the value S or l obtained by the S & l operating portion 172 with the reference values stored in the S & l reference value storing portion 20, and if the former is larger than the latter, an error signal is applied to the overlapping/parallel portion identifying portion 171. That is, in such a case there is a very fair possibility that crosstalk is caused. In response to the error signal, the overlapping/parallel portion identifying portion 171 stores the previously obtained coordinate data specifying the overlapping portion 57 and the effective parallel portion 58 in the error file 21.

Figure 8A:
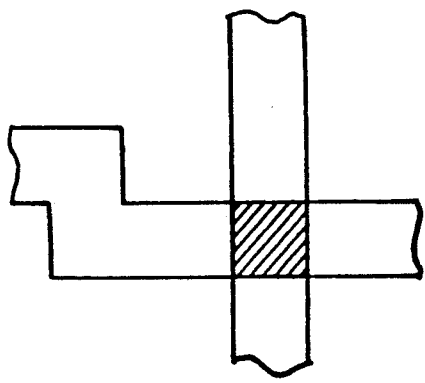
FIGS. 8A and 8B are diagrams showing examples of displayed error on a layout pattern, respectively.
Figure 8B:
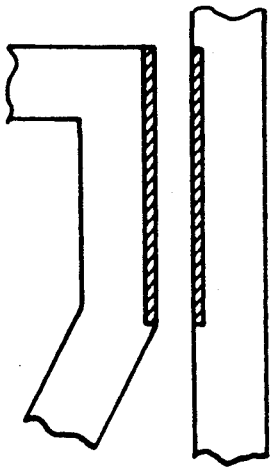

A display unit 22 receives the layout pattern data stored in the layout pattern data memory 11 and the coordinate data stored in the error file 21 to display layout patterns so emphasized that errors can be easily visually recognized, as shown in FIGS. 8A and 8B.

Figure 9:
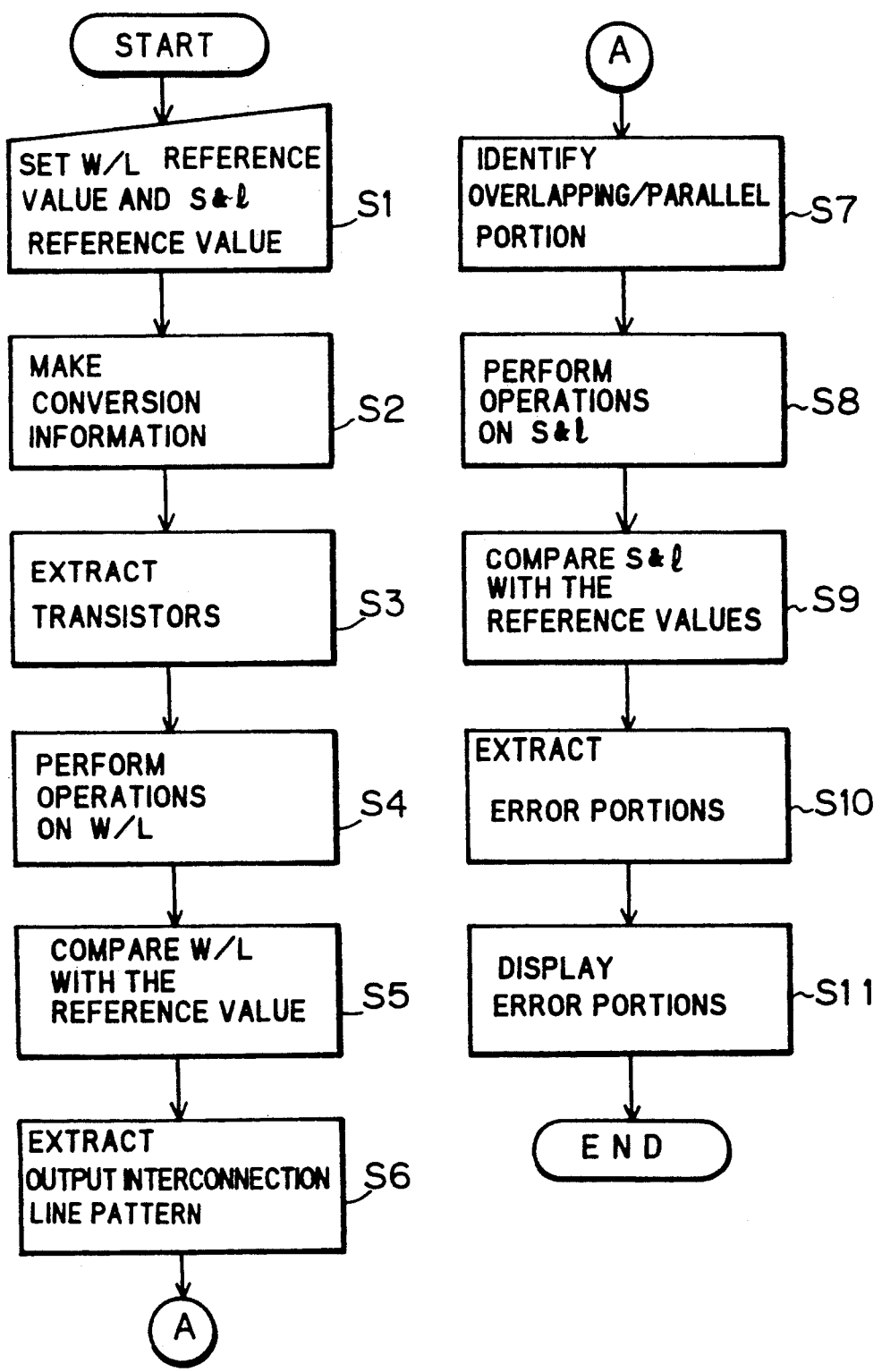
FIG. 9 is a flow chart showing a processing procedure in the case of implementing the function of the device of FIG. 1 using a computer.

FIG. 9 is a flow chart showing a processing procedure in implementing the function of the crosstalk verification device shown in FIG. 1 with a well-known computer including a storing unit and a CPU. The program of the processing procedure is stored in the storing unit. The CPU works in accordance with the program to implement the function of the extracting portions 15 and 17 and the conversion information making portion 18. The storing unit serves as the memory 11, files 12, 16 and 21 and the storing portions 13, 19 and 20.

At step S1, with the input unit 14, the W/L reference value and the S & l reference values are stored in the W/L reference value storing portion 13 and the S & l reference value storing portion 20, respectively. At step S2, referring to the description of the definition (iv) in the design rule file 12, the conversion information on the relations between S and l as expressed by the equations (3) and (4) is made and stored in the conversion information storing portion 19.

Then, at step S3, the transistor's definition in the definition (i) in the design rule file 12 is applied to the layout pattern stored in the layout pattern data memory 11, so that the transistor in the layout pattern is identified and the data on the pattern of the transistor is extracted. At step S4, the definition (ii) in the design rule file 12 is applied to the data on the pattern of the extracted transistor, so that operations are performed to obtain the transistor size W/L, and then at step S5, the transistor size W/L is compared with the reference values stored in the W/L reference value storing portion 13, so that the transistor easily exerting influence of crosstalk and the transistor easily influenced by crosstalk are identified. Thereafter, at step S6, the coordinate data on the output interconnection line patterns of the transistor easily exerting influences of crosstalk and the transistor easily influenced by crosstalk are extracted from the layout pattern data stored in the layout pattern data memory 11 by applying the definition of interconnection line in the definition (i). The extracted coordinate data are so accumulated in the output interconnection line pattern file 16 that it can be confirmed whether they are the data on the transistor easily exerting influences of crosstalk or the data on the transistor easily influenced by crosstalk.

At step S7, the portion 57 where the output interconnection line 55 of the transistor easily exerting influences of crosstalk and the output interconnection line 56 of the transistor easily influenced by crosstalk overlap with each other and the portion 58 where they are in parallel are identified based upon the coordinate data accumulated in the output interconnection line pattern file 16. With regard to the parallel portion 58, only a portion where the distance D between interconnection lines is in a predetermined range from the minimum value presented in the definition (v) in the design rule file 12 is made effective. At step S8, operations are performed to obtain the area S of the overlapping portion 57 and the length l of the effective parallel portion 58. When there are more than one of areas S or lengths l, the total value of the respective areas S or lengths l is obtained. When there are both areas S and lengths l, one of the values S or l are converted into the other, referring to the conversion information stored in the conversion information storing portion 19, and then the total value is obtained.

At step S9, the total value of the areas S or the lengths l are compared with the reference value stored in the S & l reference value storing portion 20, and at step S10, the coordinate data on portions where errors are caused (i.e., the overlapping portion 57 and the effective parallel portion 58) are extracted based upon the comparison results. The coordinate data thus extracted are accumulated in the error file 21. Eventually, at step S11, the portions where errors are caused are displayed by the display unit 22 based upon the layout pattern data stored in the layout pattern data memory 11 and the coordinate data stored in the error file 21.

Figure 10:
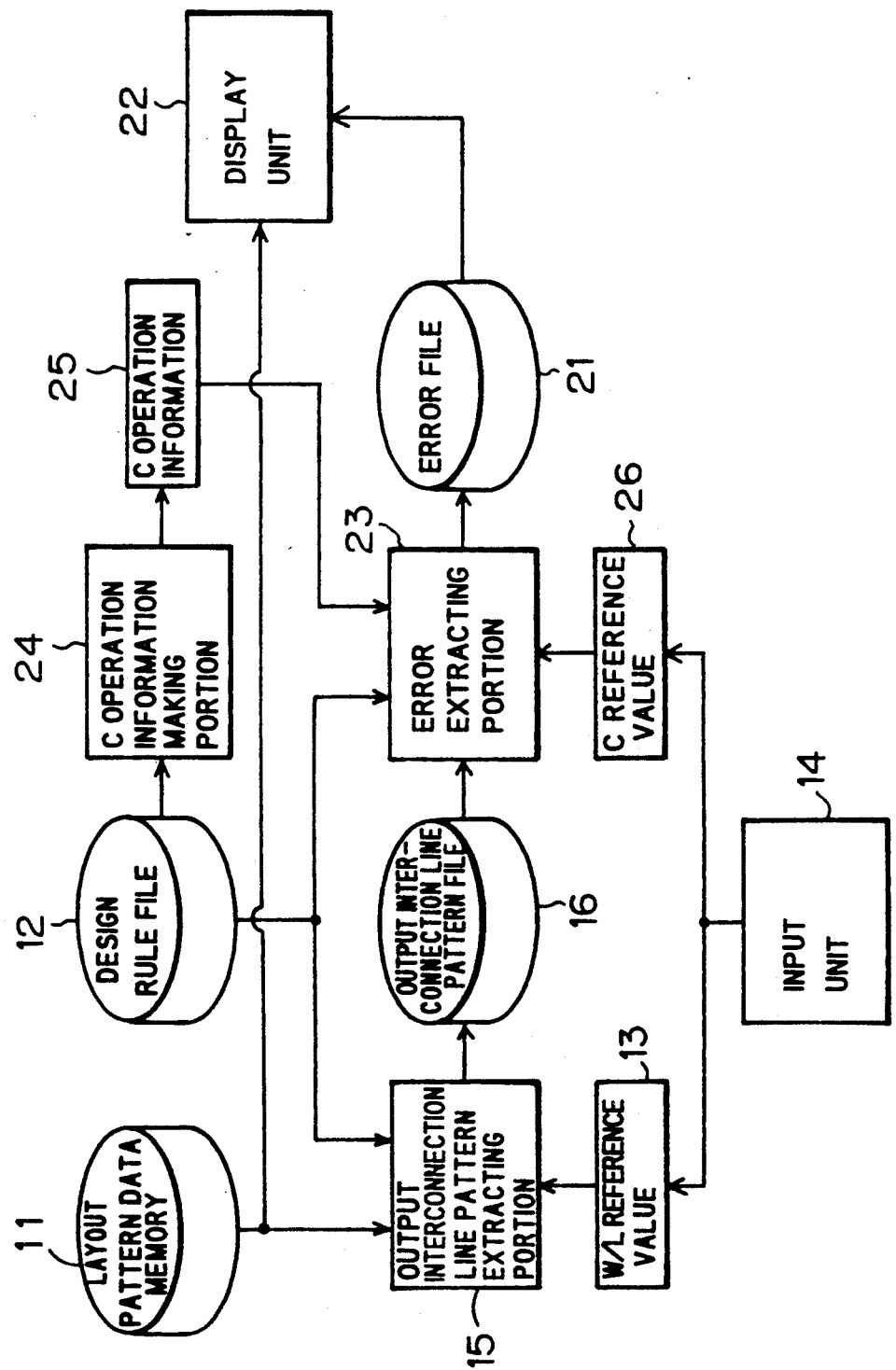
FIG. 10 is a block diagram showing another embodiment of the crosstalk verification device according to the present invention.

FIG. 10 is a block diagram showing another embodiment of the crosstalk verification device according to the present invention. There is no difference from the embodiment in FIG. 1 except for an error extracting portion 23, a C operation information making portion 24, a C operation information storing portion 25 and a C reference value storing portion 26, and these components alone will be explained below. Other components and the operation are similar to those in the embodiment shown in FIG. 1.

The error extracting portion 23 applies to the error file 21 as error information the coordinate data specifying overlapping and parallel portions of the output interconnection lines of the transistor easily exerting the influence of crosstalk and the transistor easily influenced by crosstalk, with respect to a pair of the output interconnection lines which have predetermined values or over in total values of capacities of the overlapping portions and capacities of the parallel portions, by processing the coordinate data on the output interconnection line patterns in the output interconnection line pattern file 16, referring to the contents of the design rule file 12, the C operation information storing portion 25 and the C reference value storing portion 26.

Figure 11:
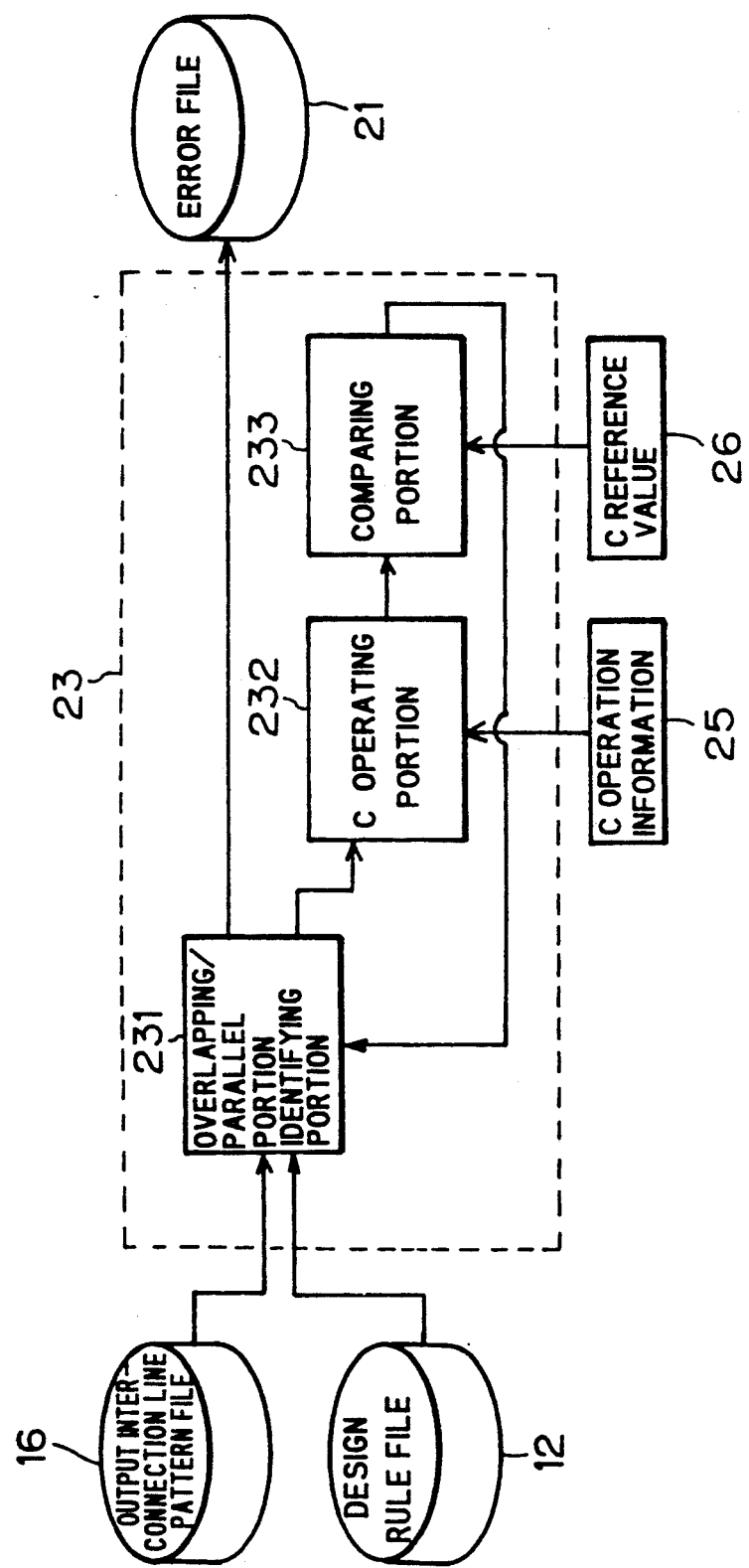
FIG. 11 is a block diagram showing in detail an error extracting portion of the device of FIG. 10.

FIG. 11 is a block diagram showing the error extracting portion 23 in detail. The error extracting portion 23 consists of an overlapping/parallel portion identifying portion 231, a C operating portion 232 and a comparing portion 233.

The overlapping/parallel portion identifying portion 231, similar to the overlapping/parallel portion identifying portion 171 in the aforementioned embodiment, identifies the portion 57 where the output interconnection line 55 of the transistor easily exerting influences on crosstalk and the output interconnection line 56 of the transistor easily influenced by crosstalk overlap with each other and the portion 58 where they are in parallel, based upon the coordinate data on the output interconnection line patterns stored in the output interconnection line pattern file 16, as shown in FIGS. 6A and 7A, and finds the line-to-line distance D in the parallel portion 58. The overlapping/parallel portion identifying portion 231 refers to the description in the definition (v) in the design rule file 12 and recognizes only the parallel portion 58 having the line-to-line distance D approximate to the minimum value indicated by the definition (v) to be the effective parallel portion 58. The overlapping/parallel portion identifying portion 231 applies the coordinate data specifying the overlapping portion 57 and the effective parallel portion 58 and the distance D between interconnection lines to the C operating portion 232.

C operation information made by the C operation information making portion 24 is stored in the C operation information storing portion 25. The C operation information making portion 24 makes the C operation information as follows: The capacity $C_1$ of the overlapping portion in FIG. 6A and the capacity $C_2$ of the parallel portion 58 in FIG. 7A are expressed, respectively, as follows:

$$C_1 = \epsilon S/T_1 \quad (5)$$

$$C_2 = \epsilon T_2 l/D \quad (6)$$

where $\epsilon$ is a dielectric constant of the insulating film 59, $T_1$ is a thickness of the insulating film 59 between the interconnection lines 55 and 56 in the overlapping portion 57, $T_2$ is a film thickness of the interconnection lines 55 and 56 and D is a distance between the interconnection lines 55 and 56 in the parallel portion 58. The C operation information making portion 24 obtains the dielectric constant $\epsilon$, the insulating film thickness $T_1$ and the interconnection line film thickness $T_2$, referring to the description of the definition (iv) in the design rule file 12, and stores in the C operation information storing portion 25 as the C operation information the equations (5) and (6) to which these values are substituted.

The C operating unit 232 performs operations to obtain the area S of the overlapping portion 57 and the length l of the effective parallel portion 58 based upon the coordinate data received from the overlapping/parallel portion identifying portion 231. The C operating portion 232 refers to the C operation information stored in the C operation information storing portion 25 and finds the capacity $C_1$ of the overlapping portion 57 and the capacity $C_2$ of the effective parallel portion 58 by substituting the area S of the overlapping portion 57, the length l of the effective parallel portion 58 and the distance D between interconnection lines in the effective parallel portion 58 into the equations (5) and (6). When there are more than one of the overlapping portions 57 and the effective parallel portions 58 for a specific pair of the output interconnection lines 55 and 56, the C operating portion 232 finds the total of the capacities $C_1$ and $C_2$.

In the C reference storing portion 26 the reference value of the capacity C received from the input unit 14 is stored in advance. The comparing portion 233 compares the total value obtained by the C operating portion 232 with the reference value stored in the C reference value storing portion 26, and if the former is larger than the latter, an error signal is applied to the overlapping/parallel portion identifying portion 231. That is, in such a case there is a very fair possibility that crosstalk is caused. In response to the error signal, the overlapping/parallel portion identifying portion 231 stores the previously obtained coordinate data specifying the overlapping portion 57 and the effective parallel portion 58 in the error file 21.

The display device 22, similar to the aforementioned embodiment, receives the layout pattern data stored in the layout pattern data memory 11 and the coordinate data stored in the error file 21 and displays layout patterns so emphasized that errors can be easily visually recognized, as shown in FIGS. 8A and 8B.

Figure 12:
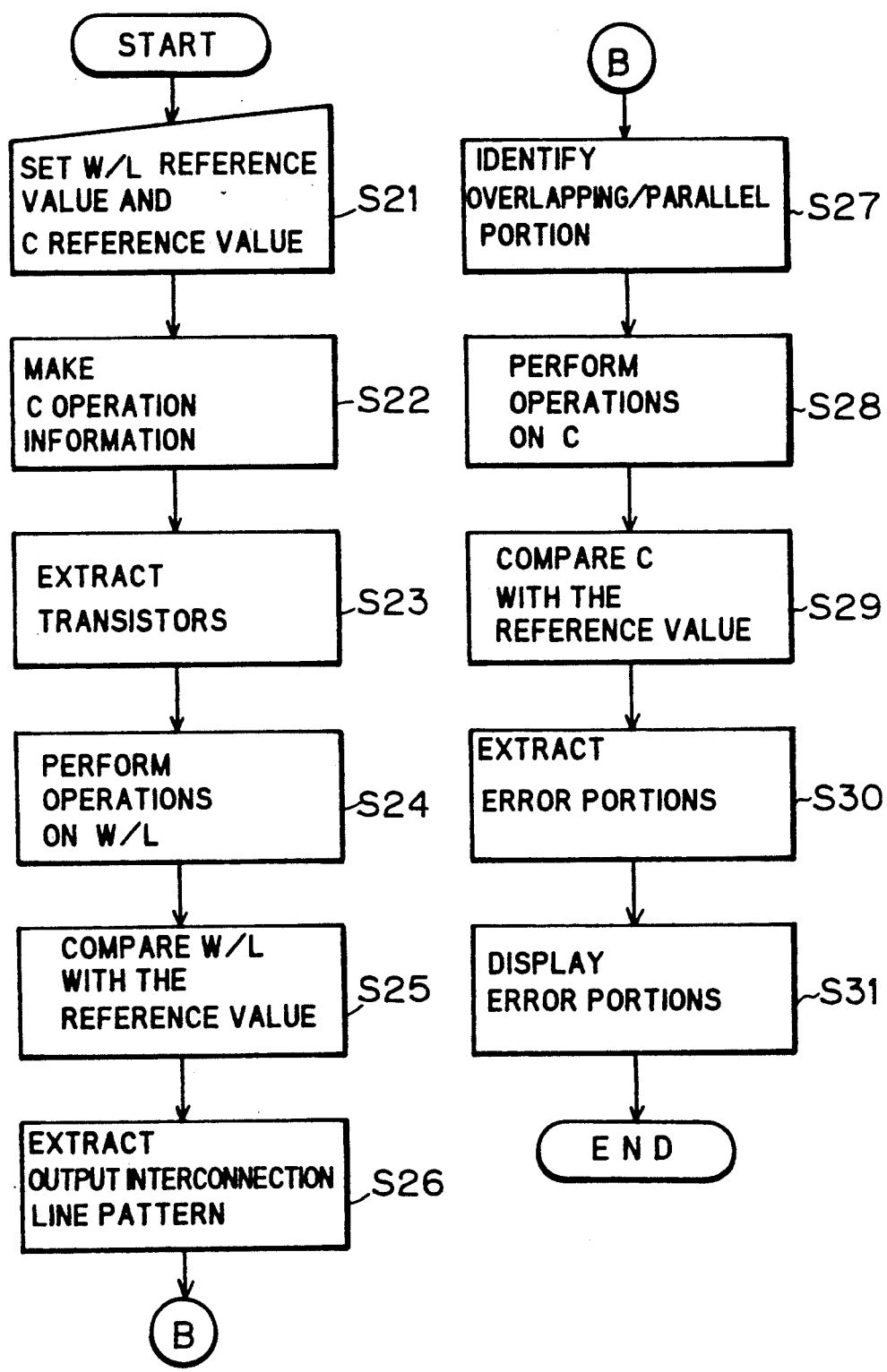
FIG. 12 is a flow chart showing a processing procedure in the case of implementing the function of the device of FIG. 10 using a computer.

FIG. 12 is a flow chart showing a processing procedure in implementing the function of the crosstalk verification device shown in FIG. 10 with a well-known computer including a storing unit and a CPU. The program of the processing procedure is stored in the storing unit. The CPU works in accordance with the program to implement the function of the extracting portions 15 and 23 and the making portion 24. The storing unit serves as the memory 11, files 12, 16 and 21 and storing portions 13, 25 and 26.

At step S21, with the input unit 14, the W/L reference value and the C reference value are stored in the W/L reference value storing portion 13 and the C reference value storing portion 26, respectively. At step S22, referring to the description of the definition (iv) in the design rule file 12, the C operation information expressed by the equations (5) and (6) is made and stored in the C operation information storing portion 25. The procedures from the succeeding steps S23 to S26 are the same as those of the steps S3 to S6 in the aforementioned embodiment. At step S27, similar to the step S7 in the aforementioned embodiment, the portion 57 where the output interconnection line 55 of the transistor easily exerting influences of crosstalk and the output interconnection line 56 of the transistor easily influenced by crosstalk overlap with each other and the portion 58 where they are in parallel are identified based upon the coordinate data accumulated in the output interconnection line pattern file 16, and the distance D between interconnection lines in the parallel portion 58 is found. With regard to the parallel portion 58, referring to the description of the definition (v) in the design rule file 12, only the portion 58 where the line-to-line distance D is within a predetermined range from the minimum value indicated by the definition (v) is recognized to be effective.

At step S28 following the step S27, operations are performed to obtain the area S of the overlapping portion 57 and the length l of the effective parallel portion 58, and the capacity $C_1$ of the overlapping portion 57 and the capacity $C_2$ of the effective parallel portion 58 are operated using the values S and l obtained by the operations and the value D obtained at step S27, referring to the C operation information stored in the C operation information storing portion 25. Then, the total of the capacities $C_1$ and $C_2$ are calculated.

Then at step S29, the total of the capacities $C_1$ and $C_2$ is compared with the reference value stored in the C operation information storing portion 25, and at step S30, based upon the comparison results, the coordinate data on portions where errors are caused (i.e., the overlapping portion 57 and the effective parallel portion 58) are extracted. The coordinate data thus extracted are accumulated in the error file 21. Eventually at step S31, based upon the layout pattern data stored in the layout pattern data memory 11 and the coordinate data stored in the error file 21, the portions where errors are caused are displayed on the layout pattern by the display unit 22.

Figure 13:
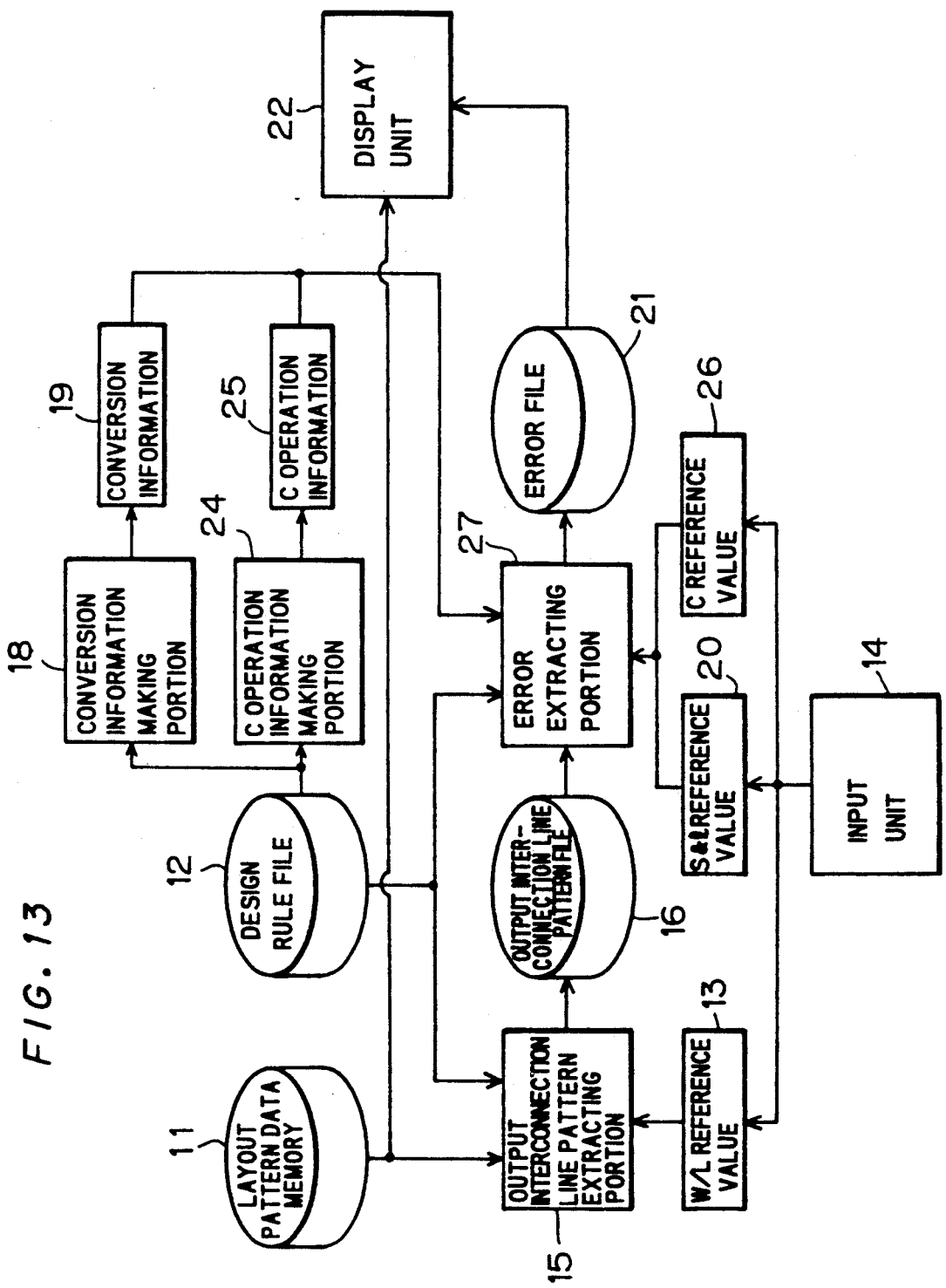
FIG. 13 is a block diagram showing still another embodiment of the crosstalk verification device according to the present invention; 1

FIG. 13 is a block diagram showing still another embodiment of the crosstalk verification device according to the present invention. The embodiment is a combination of the embodiment shown in FIG. 1 and the embodiment shown in FIG. 10. For example, blocks of reference numerals 11 to 16, 18 to 22 and 24 to 26 are the same as the blocks of like reference numerals in FIGS. 1 and 10. In this embodiment, the error extracting portion 27 has the function of both the error extracting portion 17 shown in FIG. 1 and the error extracting portion 23 shown in FIG. 10.

Figure 14:
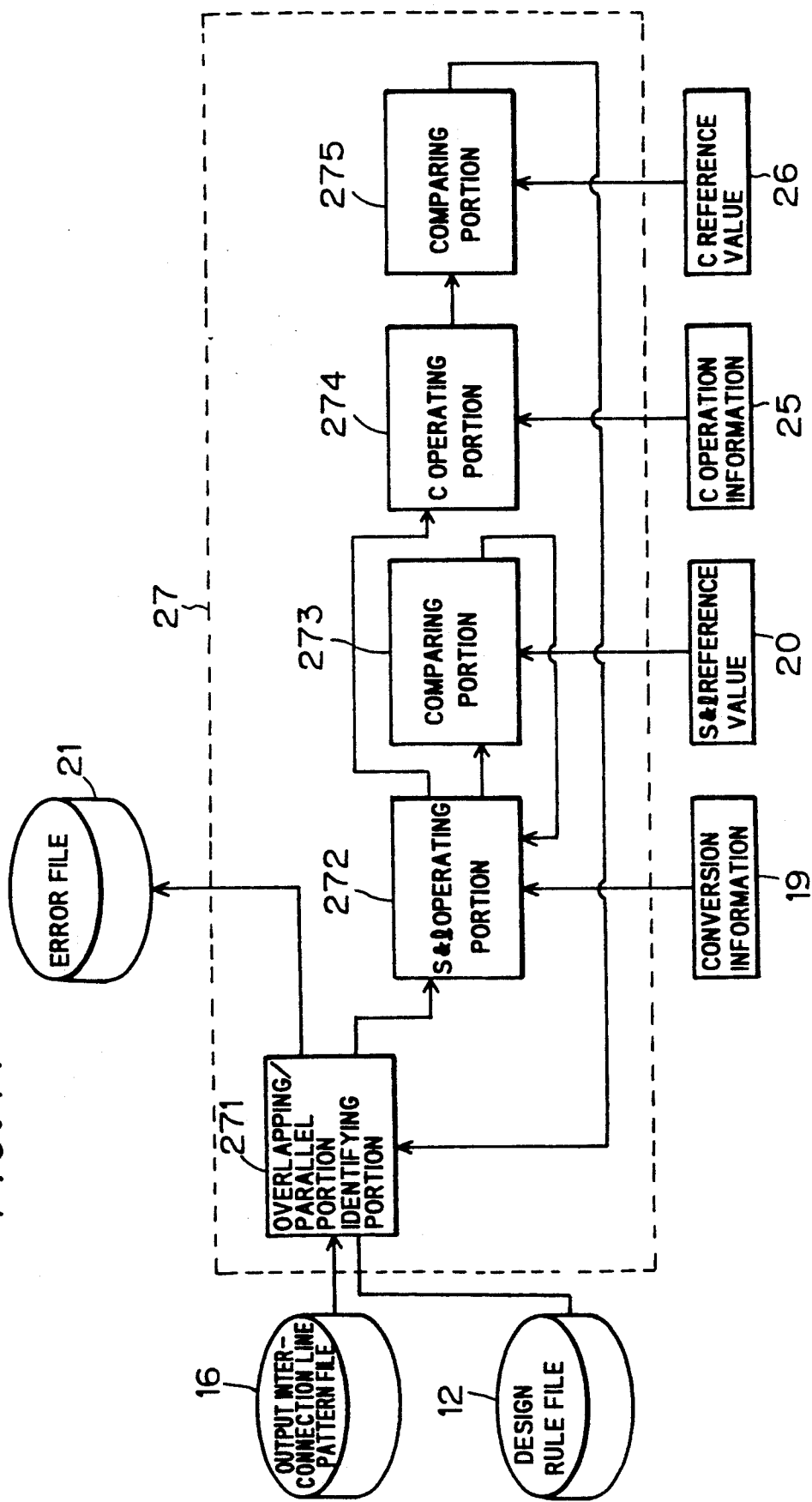
FIG.14 is a block diagram showing in detail of an error extracting portion of the device of FIG. 13.

FIG. 14 is a block diagram showing the error extracting portion 27 in detail. The error extracting portion 27 consists of an overlapping/parallel portion identifying portion 271, an S & l operating portion 272, a comparing portion 273, a C operating portion 274 and a comparing portion 275. In these components, the overlapping/parallel portion identifying portion 271, the S & l operating portion 272 and the comparing portion 273 are the same as the overlapping/parallel portion identifying portion 171, the S & l operating portion 172 and the comparing portion 173 shown in FIG. 5.

An error signal outputted by the comparing portion 273 is applied to the S & l operating portion 272. The S & l operating portion 272, in response to the error signal, applies to the C operating portion 274 the area S of the overlapping portion 57 of the output interconnection lines 55 and 56 and the length l of the parallel portion 58 previously obtained by the operations and the distance D between interconnection lines in the parallel portion 58 received from the overlapping/parallel portion identifying portion 271. The C operating portion 274, with the applied S, l and D, referring to the C operation information stored in the C operation information storing portion 25, performs operations to obtain the capacity $C_1$ of the overlapping portion 57 and the capacity $C_2$ of the effective parallel portion 58, and finds the total of the capacities $C_1$ and $C_2$ for a specific pair of the interconnection lines 55 and 56.

The comparing portion 275 compares the total value obtained by the C operating portion 274 with the reference value stored in the C reference value storing portion 26, and if the former is larger than the latter, an error signal is applied to the overlapping/parallel portion identifying portion 271. In such a case there is a very fair possibility that crosstalk is caused. In response to the error signal, the overlapping/parallel portion identifying portion 271 stores the previously obtained coordinate data specifying the overlapping portion 57 and the effective parallel portion 58 in the error file 21.

According to the present invention, operations are performed to obtain the capacity between interconnection lines as in the embodiment of FIG. 10, and hence crosstalk is accurately verified. Although the capacity between interconnection lines is calculated for all of the overlapping portion 57 and the effective parallel portion 58 in the embodiment of FIG. 10, in this embodiment the capacity between interconnection lines only in the error portion with respect to S and l is calculated, and hence the process is quickened.

Figure 15:
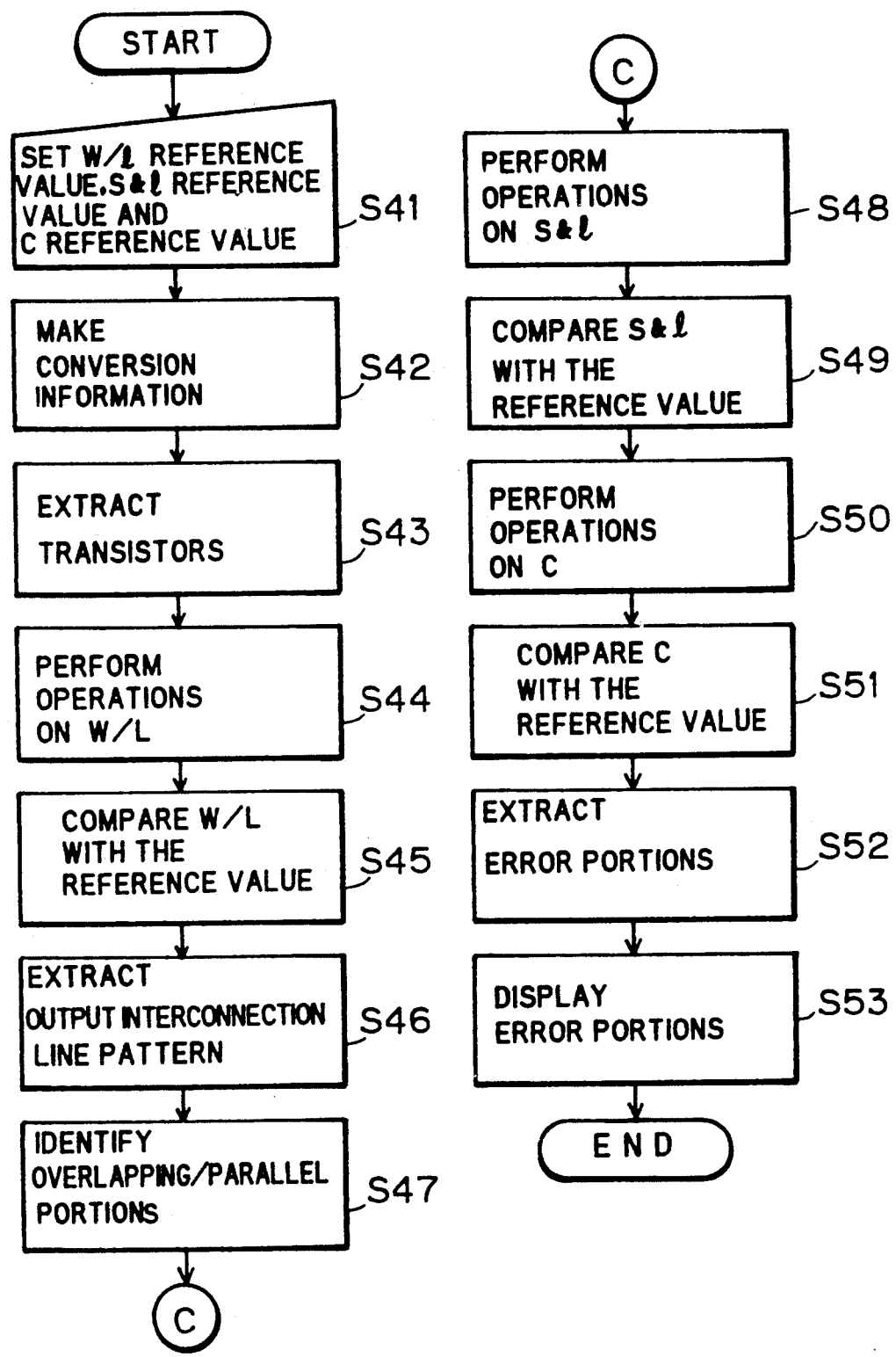
FIG. 15 is a flow chart showing a processing procedure in the case of implementing the function of the device of FIG. 13 using a computer.

FIG. 15 is a flow chart showing a processing procedure in implementing the function of the crosstalk verification device shown in FIG. 13 with a computer. The program of the processing procedure is stored in the storing unit. The CPU works in accordance with the storing program to implement the function of the extracting portions 15 and 27 and the making portions 18 and 24. The storing unit serves as the memory 11, the files 12, 16 and 21 and the storing portions 13, 19, 20, 25 and 26.

At step S41, with the input unit 14, the W/L reference value, the S & l reference value and the C reference value are stored in the W/L reference value storing portion 13, the S & l reference value storing portion 20 and the C reference value storing portion 26, respectively. At step S42, referring to the description of the definition (iv) in the design rule file 12, the conversion information on the relation between S and l as expressed by the equations (3) and (4) and the C operation information as expressed by the equations (5) and (6) are made and stored in the conversion information storing portion 19 and the C operation information storing portion 25, respectively. After steps S43 to S48, at step S49, the total value of the area S of the overlapping portion 57 of the output interconnection lines 55 and 56 and the length l of the effective parallel portion 58 is compared with the reference values stored in the S & l reference value storing portion 20, the procedures in the steps S43 to S49 being similar to those in the steps S3 to S9 in the first embodiment.

At step S50, only when the comparison result at the step S49 is found an error, the capacity $C_1$ of the overlapping portion 57 and the capacity $C_2$ of the effective parallel portion 58 are calculated, referring to the C operation information stored in the C operation information storing portion 25, and the total of the capacities $C_1$ and $C_2$ is further obtained.

At step S51, the total of the capacities $C_1$ and $C_2$ is compared with the reference value stored in the C reference value storing portion 25, and at step S52, based upon the comparison result, the coordinate data on the error portions (i.e. the overlapping portion 57 and the effective parallel portion 58) are extracted. The coordinate data thus extracted are accumulated in the error file 21. Eventually, at step S53, based upon the layout pattern data stored in the layout pattern data memory 11 and the coordinate data stored in the error file 21, the error portions are displayed on the layout pattern by the display unit 22.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A crosstalk verification device, comprising:
    first providing means for providing layout pattern data defining a layout pattern to be verified;
    second providing means for providing a design rule on said layout pattern to be verified;
    first storing means for storing a first reference on a size of a transistor easily exerting an influence of crosstalk and a second reference on a size of a transistor easily influenced by crosstalk;
    first extracting means coupled with said first and second providing means and said first storing means for extracting data on output interconnection line patterns of a first transistor satisfying said first reference and a second transistor satifying said second reference out of transistors in said layout pattern to be verified, from said layout pattern data, by processing said layout pattern data with said design rule and said first and second references referred;
    second storing means for storing a third reference on an area of an overlapping portion of output interconnection lines and a fourth reference on a length of a parallel portion of said output interconnection lines;
    second extracting means coupled with said first extracting means and said second storing means for extracting as error portions said overlapping portion of an area exceeding said third reference and said parallel portion of a length exceeding said fourth reference between said output interconnection lines of said first and second transistors by processing said data on output interconnection patterns with said third and fourth references referred;
    display means connected with said second extracting means for visually displaying said error portions.

2. A crosstalk verification device in accordance with claim 1, further comprising:
    a first file means connected with said first extracting means for accumulating said data on output interconnection line patterns extracted by said first extracting means to supply them to said second extracting means.

3. A crosstalk verification device in accordance with claim 1, further comprising:
    a second file means connected with said second extracting means for accumulating data on said error portions extracted by said second extracting means to supply them to said display means.

4. A crosstalk verification device in accordance with claim 1, wherein
    said first extracting means comprises:
    data extracting means connected with said first and second providing means for extracting coordinate data on said transistor in said layout pattern;
    transistor size operating means connected with said data extracting means for operating a transistor size of said transistor in said layout pattern based upon said coordinate data; and
    comparing means connected with said transistor size operating means and said first storing means for comparing said transistor size with said first and second references to identify said first and second transistors.

5. A crosstalk verification device in accordance with claim 1, wherein
    said second extracting means comprises:
    overlapping/parallel portion identifying means coupled with said second providing means and said first extracting means for identifying said overlapping and parallel portions of said output interconnection lines of said first and second transistors;
    area and length operating means connected with said overlapping/parallel portion identifying means for operating said area of said overlapping portion as identified and said length of said parallel portion as identified; and
    comparing means connected with said area and length operating means and said second storing means for comparing said area and length as operated with said third and fourth references, respectively, to identify said overlapping portion of said area exceeding said third reference and said parallel portion of said length exceeding said fourth reference.

6. A crosstalk verification device in accordance with claim 5, wherein
    said design rule includes a definition defining a minimum value of a distance between said output interconnection lines,
    said overlapping/parallel portion identifying means makes effective only said parallel portions of said output interconnection lines approximate in distance to said minimum value.

7. A crosstalk verification device in accordance with claim 5, further comprising:
conversion information making means connected with said second providing means for making conversion information between said area of said overlapping portion and said length of said parallel portion based upon said design rule, wherein
said area and length operating means operates said area and length by converting one of said area and length of said overlapping and parallel portions with respect to the same output interconnection lines to the other based upon said conversion information and summing up them.

8. A crosstalk verification device in accordance with claim 1, wherein
said first providing means includes a layout pattern data memory.

9. A crosstalk verification device in accordance with claim 1, wherein
said second providing means includes a design rule file.

10. A crosstalk verification device, comprising:
first providing means for providing layout pattern data defining a layout pattern to be verified;
second providing means for providing a design rule on said layout pattern to be verified;
first storing means for storing a first reference on a size of a transistor easily exerting an influence of crosstalk and a second reference on a size of a transistor easily influenced by crosstalk;
first extracting means coupled with said first and second providing means and said first storing means for extracting data on output interconnection line patterns of a first transistor satisfying said first reference and a second transistor satisfying said second reference out of transistors in said layout pattern to be verified, from said layout pattern data, by processing said layout pattern data with said design rule and said first and second references referred;
second storing means for storing a third reference on a capacity of overlapping and parallel portions of output interconnection lines;
second extracting means coupled with said first extracting means and said second storing means for extracting as error portions said overlapping and parallel portions of a capacity exceeding said third reference of said output interconnection lines of said first and second transistors by processing said data on output interconnection patterns with said third reference referred;
display means connected with said second extracting means for visually displaying said error portions.

11. A crosstalk verification device in accordance with claim 10, further comprising:
a first file means connected with said first extracting means for accumulating said data on output interconnection line patterns extracted by said first extracting means to supply them to said second extracting means.

12. A crosstalk verification device in accordance with claim 10, further comprising:
a second file means connected with said second extracting means for accumulating data on said error portions extracted by said second extracting means to supply them to said display means.

13. A crosstalk verification device in accordance with claim 10, wherein
said first extracting means comprises:
data extracting means connected with said first and second providing means for extracting coordinate data on said transistor in said layout pattern;
transistor size operating means connected with said data extracting means for operating a transistor size of said transistor in said layout pattern based upon said coordinate data; and
comparing means connected with said transistor size operating means and said first storing means for comparing said transistor size with said first and second references to identify said first and second transistors.

14. A crosstalk verification device in accordance with claim 10, wherein
said second extracting means comprises:
overlapping/parallel portion identifying means coupled with said second providing means and said first extracting means for identifying said overlapping and parallel portions of said output interconnection lines of said first and second transistors;
capacity operating means connected with said overlapping/parallel portion identifying means for operating said capacity of said overlapping and parallel portions as identified; and
comparing means connected with said capacity operating means and said second storing means for comparing said capacity as operated with said third reference to identify said overlapping and parallel portions of said capacity exceeding said third reference.

15. A crosstalk verification device in accordance with claim 14, wherein
said design rule includes a definition defining a minimum value of a distance between said output interconnection lines,
said overlapping/parallel portion identifying means makes effective only said parallel portions of said output interconnection lines approximate in distance to said minimum value.

16. A crosstalk verification device in accordance with claim 14, further comprising:
capacity operation information making means connected with said second providing means for making capacity operation information for use in operation of said capacity of said overlapping and parallel portions based upon said design rule, wherein
said capacity operating means operates said capacity based upon said capacity operation information.

17. A crosstalk verification device in accordance with claim 10, wherein
said first providing means includes a layout pattern data memory.

18. A crosstalk verification device in accordance with claim 10, wherein
said second providing means includes a design rule file.

19. A crosstalk verification device, comprising:
first providing means for providing layout pattern data defining a layout pattern to be verified;
second providing means for providing a design rule on said layout pattern to be verified;
first storing means for storing a first reference on a size of a transistor easily exerting an influence of crosstalk and a second reference on a size of a transistor easily influenced by crosstalk;
first extracting means coupled with said first and second providing means and said first storing means for extracting data on output interconnection line patterns of a first transistor satisfying said first reference and a second transistor satisfying said second reference out of transistors in said layout pattern to be verified, from said layout pattern data, by processing said layout pattern data with said design rule and said first and second references referred;

second storing means for storing a third reference on an area of an overlapping portion of output interconnection lines and a fourth reference on a length of a parallel portion of said output interconnection lines;

third storing means for storing a fifth reference on a capacity of said overlapping and parallel portions of output interconnection lines;

second extracting means composed of ante-stage extracting means coupled with said first extracting means and said second storing means for extracting as error portions said overlapping portion of an area exceeding said third reference and said parallel portion of a length exceeding said fourth reference between said output interconnection lines of said first and second transistors by processing said data on output interconnection patterns with said third and fourth references referred and post-stage extracting means coupled with said third storing means and said ante-stage extracting means for extracting as an effective error portion only said error portions which is larger in capacity than said fifth reference;

display means connected with said second extracting means for visually displaying said error portions.

20. A crosstalk verification device in accordance with claim 19, further comprising:
a first file means connected with said first extracting means for accumulating said data on output interconnection line patterns extracted by said first extracting means to supply them to said second extracting means.

21. A crosstalk verification device in accordance with claim 19, further comprising:
a second file means connected with said second extracting means for accumulating data on said error portions extracted by said second extracting means to supply them to said display means.

22. A crosstalk verification device in accordance with claim 19, wherein
said first extracting means comprises:
data extracting means connected with said first and second providing means for extracting coordinate data on said transistor in said layout pattern;
transistor size operating means connected with said data extracting means for operating a transistor size of said transistor in said layout pattern based upon said coordinate data; and
comparing means connected with said transistor size operating means and said first storing means for comparing said transistor size with said first and second references to identify said first and second transistors.

23. A crosstalk verification device in accordance with claim 19, wherein
said ante-stage extracting means comprises:
overlapping/parallel portion identifying means coupled with said second providing means and said first extracting means for identifying said overlapping and parallel portions of said output interconnection lines of said first and second transistors;
area and length operating means connected with said overlapping/parallel portion identifying means for operating said area of said overlapping portion as identified and said length of said parallel portion as identified; and
first comparing means connected with said area and length operating means and said second storing means for comparing said area and length as operated with said third and fourth references, respectively, to identify said overlapping portion of said area exceeding said third reference and said parallel portion of said length exceeding said fourth reference.

24. A crosstalk verification device in accordance with claim 23, wherein
said post-stage extracting means comprises:
capacity operating means connected with said area and length operating means for operating said capacity of said error portion; and
second comparing means connected with said capacity operating means and said third storing means for comparing said capacity as operated with said fifth reference to identify said effective error portion.

25. A crosstalk verification device in accordance with claim 24, further comprising:
capacity operation information making means connected with said second providing means for making capacity operation information for use in operation of said capacity of said overlapping and parallel portions based upon said design rule, wherein
said capacity operating means operates said capacity based upon said capacity operation information.

26. A crosstalk verification device in accordance with claim 23, wherein
said design rule includes a definition defining a minimum value of a distance between said output interconnection lines,
said overlapping/parallel portion identifying means makes effective only said parallel portions of said output interconnection lines approximate in distance to said minimum value.

27. A crosstalk verification device in accordance with claim 23, further comprising:
conversion information making means connected with said second providing means for making conversion information between said area of said overlapping portion and said length of said parallel portion based upon said design rule, wherein
said area and length operating means operates said area and length by converting one of said area and length of said overlapping and parallel portions with respect to the same output interconnection lines to the other based upon said conversion information and summing up them.

28. A crosstalk verification device in accordance with claim 19, wherein:
said first providing means includes a layout pattern data memory.

29. A crosstalk verification device in accordance with claim 19, wherein:
said second providing means includes a design rule file.

* * * * *